(12) United States Patent
Chan et al.

(10) Patent No.: US 8,258,864 B1
(45) Date of Patent: Sep. 4, 2012

(54) ULTRA LOW VOLTAGE MULTI-STAGE HIGH-SPEED CMOS COMPARATOR WITH AUTOZEROING

(75) Inventors: Kwai Chi Chan, Hong Kong (HK); Yat To (William) Wong, Hong Kong (HK); Ho Ming (Karen) Wan, Hong Kong (HK); Kam Chuen Wan, Hong Kong (HK); Kwok Kuen (David) Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 0 days.

(21) Appl. No.: 13/238,236

(22) Filed: Sep. 21, 2011

(51) Int. Cl.
 *H03F 1/02* (2006.01)
(52) U.S. Cl. ............... 330/9; 330/69; 330/260; 330/51; 330/302
(58) Field of Classification Search .............. 330/9, 260, 330/51, 302, 69
See application file for complete search history.

(56) References Cited

U.S. PATENT DOCUMENTS

| | | | |
|---|---|---|---|
| 4,190,805 A * | 2/1980 | Bingham | 330/9 |
| 5,600,275 A | 2/1997 | Garavan | |
| 6,429,697 B1 | 8/2002 | Amazeen et al. | |
| 7,148,727 B2 * | 12/2006 | Van Bogget | 327/77 |
| 7,342,443 B2 * | 3/2008 | Nishimori | 330/51 |
| 7,714,644 B2 * | 5/2010 | Takemoto et al. | 330/9 |
| 7,764,215 B2 | 7/2010 | Wan et al. | |
| 7,795,970 B2 * | 9/2010 | Kaya et al. | 330/251 |

OTHER PUBLICATIONS

Ohara et al., "A CMOS Programmable Self-Calibrating 13-bit Eight-Channel Data Acquisition Peripheral", IEEE Journal of Solid-State Circuits, vol. SC-22 No. 6, Dec. 1987.
Dzahini & Ghazlane, "Auto-zero stabilized CMOS amplifiers for very low voltage or current offset", IEEE 0-7803-8257-9-04 2004, Ver. 1, Nov. 3, 2003.

* cited by examiner

*Primary Examiner* — Patricia Nguyen
(74) *Attorney, Agent, or Firm* — Stuart T. Auvinen; gPatent LLC

(57) ABSTRACT

A pre-amplifier circuit can be cascaded and drive a latch for use in a precision analog-to-digital converter (ADC). The pre-amplifier has a main section and a feedback section connected by feedback resistors that do not produce voltage drops in the main section. Offset is stored on offset capacitors during an autozeroing phase and isolated by transmission gates during an amplifying phase. The offset capacitors drive the gates of feedback transistors that drive output nodes in the main section. Autozeroing sink transistors in the feedback section operate in the linear region while current sink transistors in the main section operate in the saturated region. Kick-back-charge isolation transistors may be added for charge isolation. The output may also be equalized by an equalizing transmission gate. A very low power-supply voltage is supported even for high-speed operation with offset cancellation, due to the folded feedback resistor arrangement.

20 Claims, 8 Drawing Sheets

FIRST EMBODIMENT

ULTRA LOW VOLTAGE MULTI-STAGE HIGH-SPEED CMOS COMPARATOR WITH AUTOZEROING

FIELD OF THE INVENTION

This invention relates to Analog-to-Digital Converters (ADC), and more particularly to a comparator for an ADC.

BACKGROUND OF THE INVENTION

Offset voltages on differential inputs cannot be tolerated for some high-precision applications. One common application is a high-resolution Analog-to-Digital Converter (ADC). An ADC cannot tolerate an input offset that is greater than the least-significant-bit (LSB) since the LSB precision would be lost.

Since the gain-bandwidth product of a single stage amplifier is constant, several amplifier stages are often cascaded together. The cascade provides a desired amplification factor with minimal delay. A cascade of pre-amplifiers can amplify a small input charge to produce a sufficiently large output charge that may then drive a latch that is part of a precision device such as an ADC.

However, any random input offsets in the cascade of pre-amplifiers can be propagated through the cascade of amplifier stages and the final amplified offset can significantly degrade the precision of the system.

Auto-zeroing techniques may be used to cancel such offsets. Often two phases are used to clock the cascade of amplifiers, where offset charges are stored in one phase and signal amplification occurs in the other phase.

Power supply voltages have been reduced to avoid damaging transistors that have been shrunk for advanced semiconductor processes. The lower power-supply voltage results in circuit design challenges since transistor saturation voltages may cut the remaining power-supply voltage in some circuits. The remaining voltage may be further reduced by I*R voltage drops through resistors. Traditional amplifier circuits with a saturated transistor in series with a resistor may leave little room for amplifying transistors to operate when the supply voltage is reduced.

What is desired is a pre-amplifier stage that eliminates an I*R drop due to a resistor in series with a saturated transistor. An amplifier that can operate with reduced power supply voltages is desirable. An amplifier with auto-zeroing and a folded resistor circuit design is desired for precision applications such as for an ADC.

Precision ADC Application—FIGS. 1-2

A pre-amplifier with auto-zeroing of input offsets may be used in a precision ADC application such as described below for FIGS. 1-2. The pre-amplifier may be used for other precision applications such as a low noise amplifier, a high precision instrumentation amplifier, a high precision comparator, any offset cancellation amplifier, DAC, etc.

Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

FIG. 1 shows a Successive-Approximation-Register ADC. Successive-Approximation-Register SAR 302 receives a clock CLK and contains a register value that is changed to gradually zero-in on a close approximation of the analog input voltage VIN. For example, the value in SAR 302 may first be 0.5, then 0.25, then 0.32, then 0.28, then 0.30, then 0.31, then 0.315, then 0.313, then 0.312, when comparing to a VIN of 0.312 volts. SAR 302 outputs the current register value to digital-to-analog converter (DAC) 300, which receives a reference voltage VREF and converts the register value to an analog voltage VA.

The input analog voltage VIN is applied to sample-and-hold circuit 304, which samples and holds the value of VIN. For example, a capacitor can be charged by VIN and then the capacitor isolated from VIN to hold the analog voltage. The sampled input voltage from sample-and-hold circuit 304 is applied to the inverting input of comparator 306. The converted analog voltage VA is applied to the non-inverting input of comparator 306.

Comparator 306 compares the converted analog voltage VA to the sampled input voltage and generates a high output when the converted analog voltage VA is above the sampled VIN, and the register value in SAR 302 is too high. The register value in SAR 302 can then be reduced.

When the converted analog voltage VA is below the sampled input voltage, comparator 306 generates a low output to SAR 302. The register value in SAR 302 is too low. The register value in SAR 302 can then be increased for the next cycle.

The register value from SAR 302 is a binary value of N bits, with D(N-1) being the most-significant-bit (MSB) and D0 being the least-significant-bit (LSB). SAR 302 can first set the MSB D(N-1), then compare the converted analog voltage VA to the input voltage VIN, then adjust the MSB and/or set the next MSB D(N-2) based on the comparison. The set and compare cycle repeats until after N cycles the LSB is set. After the last cycle, the end-of-cycle EOC signal is activated to signal completion. A state machine or other controller can be used with or included inside SAR 302 to control sequencing.

Comparator 306 can be replaced with a series of pre-amplifier stages and a final latch. FIG. 2A is a response graph of pre-amplifier and latch stages. The pre-amplifier stages have a negative response shown by curve 312, while the final latch has a positive response as shown by curve 310. For low voltages, curve 312 is above and to the left curve 310, indicating that the pre-amplifiers require less time to achieve the same VOUT voltage than the latch. However, for higher VOUT voltages, curve 310 is above curve 312, indicating that for larger values of VOUT, the latch can achieve these larger voltage outputs much faster than the pre-amplifiers.

FIG. 2B shows a series of pre-amplifiers and a final latch. Pre-amplifier stages 320, 322, 324, 326, 328 are amplifiers that boost the voltage difference between VIN and VA. Especially near the end of comparison when the LSB is being set, the difference between VIN and VA can be quite small. This voltage difference is gradually increased by the pre-amplifier stages until the final stage. Latch stage 330 latches this voltage difference to generate the compare signal that is fed back to SAR 302. Thus stages 320-330 replace comparator 306 of FIG. 1.

By combining a series of pre-amplifier stages with the positive response of the final latch, a fast response time can be achieved. The pre-amplifier stages can gradually amplify and enlarge the voltage difference between VIN and VA until the amplified voltage difference is large enough to drive the final latch. The delay time can be minimized by using low-gain, wide bandwidth pre-amplifiers.

What is desired is a pre-amplifier stage that can be used in a precision ADC. A pre-amplifier that eliminates an I*R drop due to a resistor in series with a saturated transistor and can operate with reduced power supply voltages is desirable. An amplifier with auto-zeroing and a folded resistor circuit design is desired for precision applications such as for the ADC of FIG. 1.

DETAILED DESCRIPTION

The present invention relates to an improvement in precise auto-zeroing comparators and amplifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
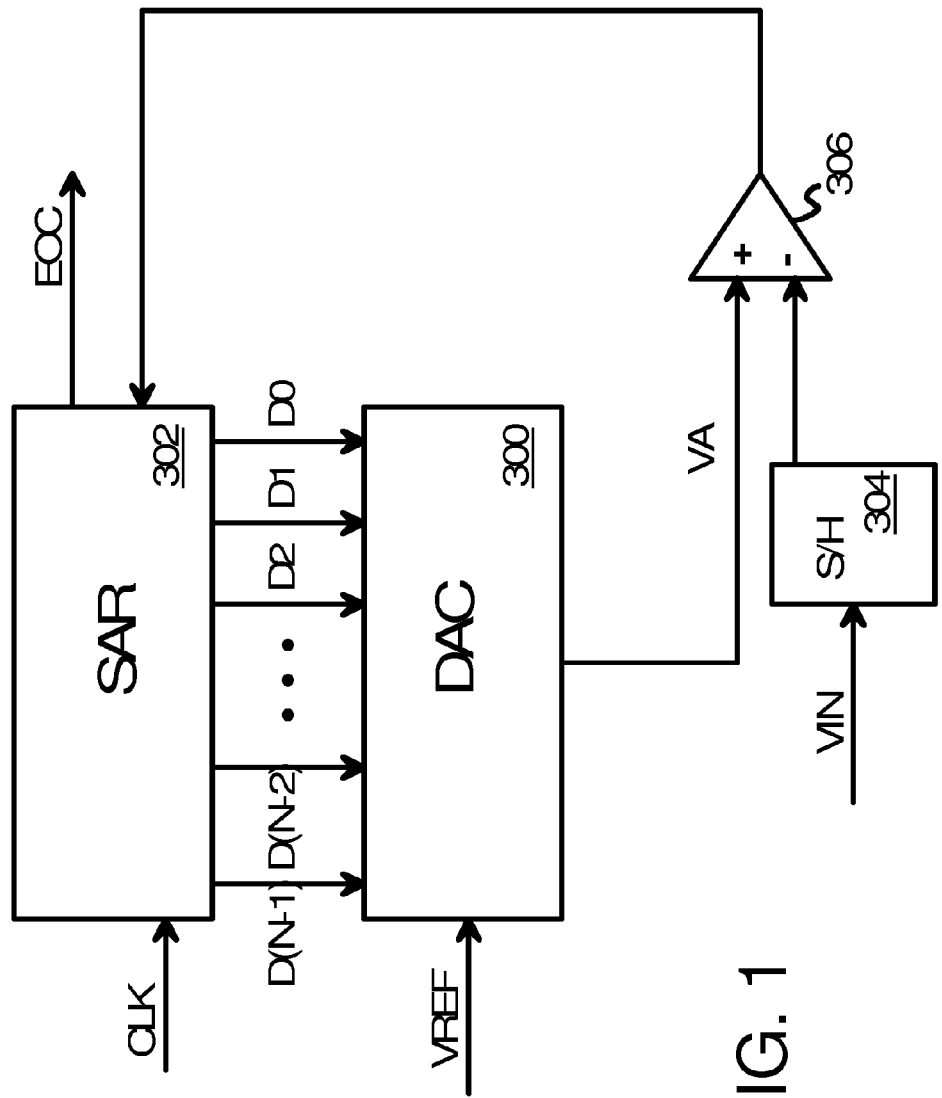
FIG. 1 shows a Successive-Approximation-Register ADC.
Figure 2A:
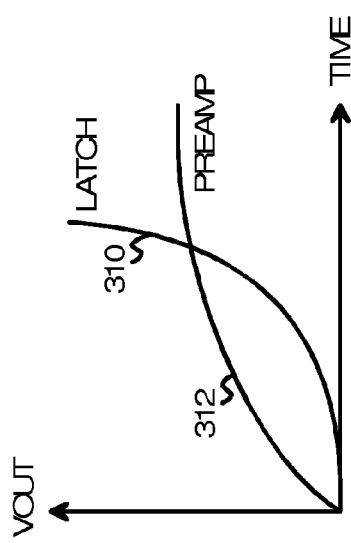
FIG. 2A is a response graph of pre-amplifier and latch stages.
Figure 2B:
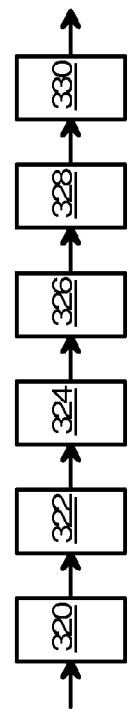
FIG. 2B shows a series of pre-amplifiers and a final latch.
Figure 3:
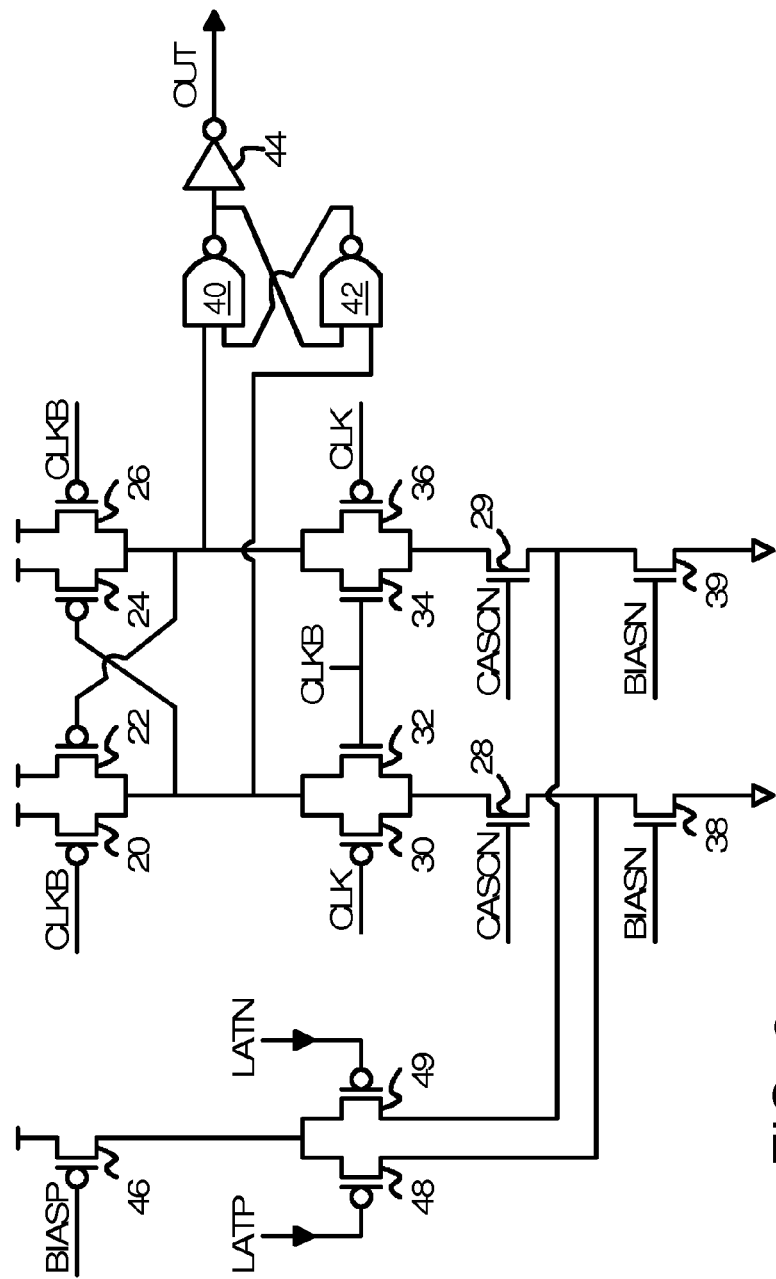
FIG. 3 is a diagram of a high-speed latch.

FIG. 3 is a diagram of a high-speed latch. The high-speed latch of FIG. 3 generates latched output OUT that can be part of an ADC, such as SAR 302 of FIG. 1. The latch inputs LATP, LATN can be the output of a final stage in a cascade of pre-amplifiers such as shown in FIG. 2B, using one of the circuits of FIGS. 4-6 for each stage in the cascade.

A bias voltage BIASP is applied to the gate of p-channel bias transistor 46, which provides current to the sources of p-channel differential transistors 48, 49. The latch input LATP, LATN is a differential signal that is output from a final stage in a cascade of pre-amplifier stages. LATP is applied to the gate of p-channel differential transistor 48 while LATN is applied to the gate of p-channel differential transistor 49.

Cross-coupled NAND gates 40, 42 form a bi-stable that drive output OUT through inverter 44. Cross-coupled p-channel transistors 22, 24 assist the settling of the bi-stable when CLK is high and CLKB is low, turning off transmission gate transistors 30, 32, 34, 36 and turning on p-channel source transistors 20, 26 to hold the state of the inputs to NAND gates 40, 42.

When CLK is low and CLKB is high, p-channel source transistors 20, 26 turn off and transmission gate transistors 30, 32, 34, 36 turn on, allowing the latch to be set or reset by inputs LATP, LATN. N-channel cascode transistors 28, 29 receive a cascode bias voltage CASCN on their gates and each form a source-follower connection to the transmission gates. Current is pulled through n-channel cascode transistors 28, 29 by n-channel current sink transistors 38, 39 when transmission gates are open (CLKB high).

LATP applied to the gate of p-channel differential transistor 48 steers less current to the drain of n-channel current sink transistor 38 when LATP is higher than LATN. This allows more current to flow through cascode transistor 28, pulling the input to NAND gate 42 lower and setting OUT high.

Figure 4:
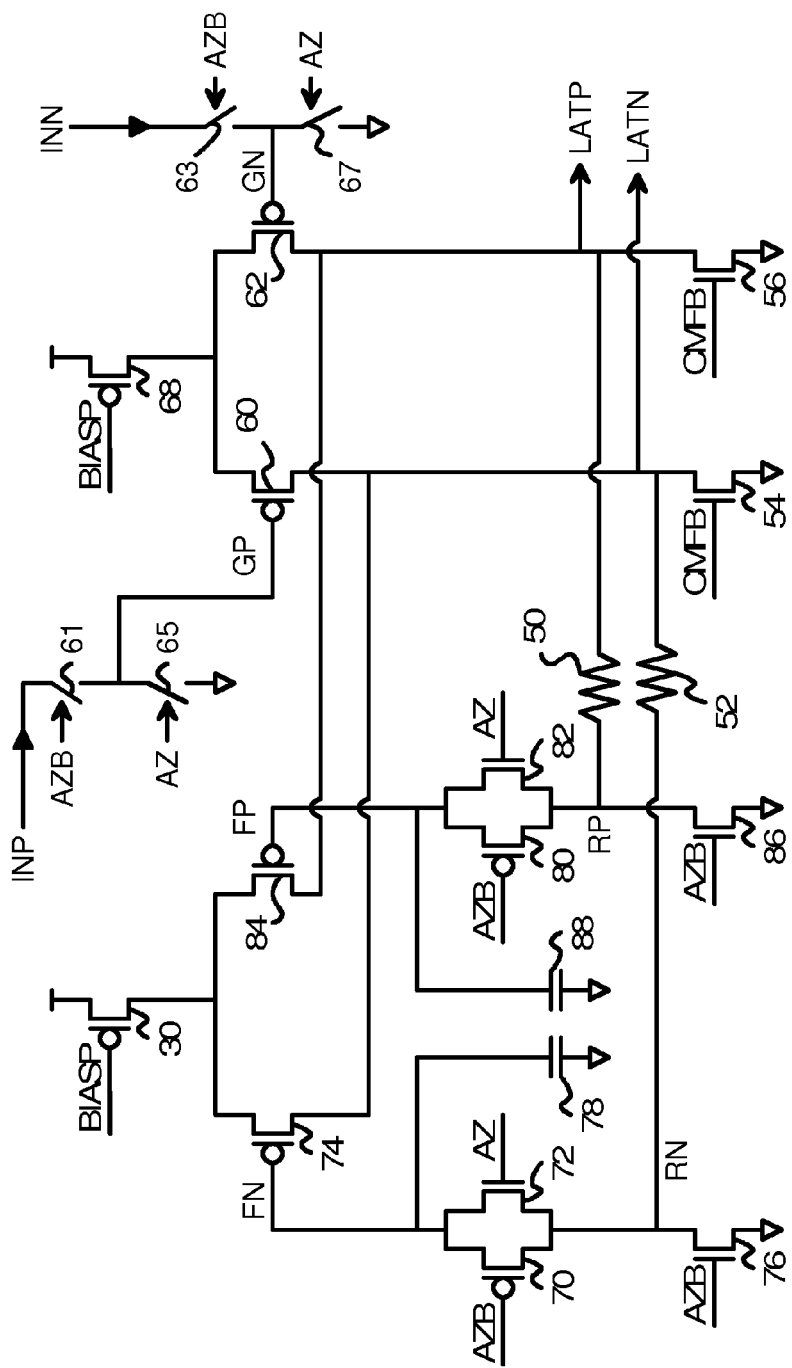
FIG. 4 is a schematic of a first embodiment of a pre-amplifier stage with a folded resistor.

FIG. 4 is a schematic of a first embodiment of a pre-amplifier stage with a folded resistor. Feedback resistors 50, 52 are not in series between the power supply and ground, and thus do not reduce the available voltage by a V=I*R drop. This allows for two p-channel transistors and one saturated n-channel transistor in series between Vcc and ground in the main section of the amplifier (transistors 68, 60, 54), and two p-channel transistors, one transmission gate, and one saturated n-channel transistor in series between Vcc and ground in the feedback section of the amplifier (transistors 30, 74, 70/72, 76). The power supply can be as low as three times the saturated transistor voltage drop, or 3*VDSAT.

The circuit of FIG. 4 can be the first stage in a cascade of pre-amplifiers, or any of the intermediate stages, or the final stage that drives the latch of FIG. 3. Inputs INP, INN can be the LATP, LATN outputs from a prior stage amplifier, or can be the external inputs when the amplifier is the first stage. Similarly, outputs LATP, LATN can drive the INP, INN inputs of a next stage in the cascade, or can drive the LATP, LATN inputs of the latch of FIG. 3.

Switches 61, 65 connect INP to gate node GP of p-channel differential transistor 60 when autozeroing signal AZ is low, but ground gate node GP during autozeroing. Similarly, switches 63, 67 connect INN to gate node GN of p-channel differential transistor 62 when autozeroing signal AZ is low, but ground gate node GN during autozeroing.

N-channel current sink transistors 54, 56 receive common-mode feedback bias voltage CMFB on their gates and sink current from the drains of p-channel differential transistors 60, 62, which are also latch outputs LATN, LATP, respectively.

P-channel source transistor 68 receives a bias voltage BIASP and provides current to the sources of p-channel differential transistors 60, 62 in the main amplifier section. In the feedback section, p-channel source transistor 30 also receives bias voltage BIASP, and provides current to the sources of p-channel feedback transistors 74, 84.

The feedback section of the pre-amplifier has n-channel autozeroing sink transistors 76, 86 that receive autozeroing signal AZB on their gates and turn on in the linear (triode) region when AZB is high. Since AZB swings to Vcc, while CMFB is a lower voltage, transistors 54, 56 in the amplifier section operate in the saturated region while transistors 76, 86 in the feedback section operate in the linear region.

During autozeroing, offset charges are stored on offset capacitors 78, 88. Transmission gate transistors 70, 72, 80, 82 turn on and autozeroing sink transistors 76, 86 turn off. Gates nodes GP, GN are grounded by switches 65, 67 so that inputs are disconnected from the main amplifier section. This isolation during autozeroing allows and offsets on differential transistors 60, 62 to pass through feedback resistors 50, 52 and transmission gate transistors 70, 72, 80, 82 to be stored on offset capacitors 78, 88.

The offsets stored on offset capacitors 78, 88 are applied to the gates of p-channel feedback transistors 74, 84, which have drains driving LATN, LATP. Thus the offsets are fed back through a feedback loop of feedback resistors 50, 52 and feedback transistors 74, 84. Charges stored on offset capacitors 78, 88 are adjusted by the feedback loop until steady-state is reached. The pre-amplifier is configured as a high-gain amplifier during autozeroing to store the offsets.

When autozeroing is completed, the offset charges are stored on offset capacitors 78, 88. During the next (amplifying) phase, AZB is high and AZ is low. Comparison and amplification of the INP, INN inputs can occur since switches 61, 63 close to connect INP, INN to the gates of differential transistors 60, 62.

Autozeroing sink transistors 76, 86 turn on and operate in the linear region. Transmission gate transistors 70, 72, 80, 82 turn off to isolate nodes RN, RP from nodes FN, FP, The offset charges on offset capacitors 78, 88 are applied to the gates of feedback transistors 74, 84 and are amplified to drive the stored offsets onto LATN, LATP to compensate for offsets in differential transistors 60, 62 or other parts of the circuit.

During the amplifying phase, the pre-amplifier is configured as a high-speed low-gain amplifier. The gain of the pre-amplifier during this phase is determined by the resistance of feedback resistors 50, 52, such as 300K-Ohms. Since feedback resistors 50, 52 are in a folded circuit configuration, the power-supply voltage to differential transistors 60, 62 is not reduced by the I*R drop through feedback resistors 50, 52.

Figure 5:
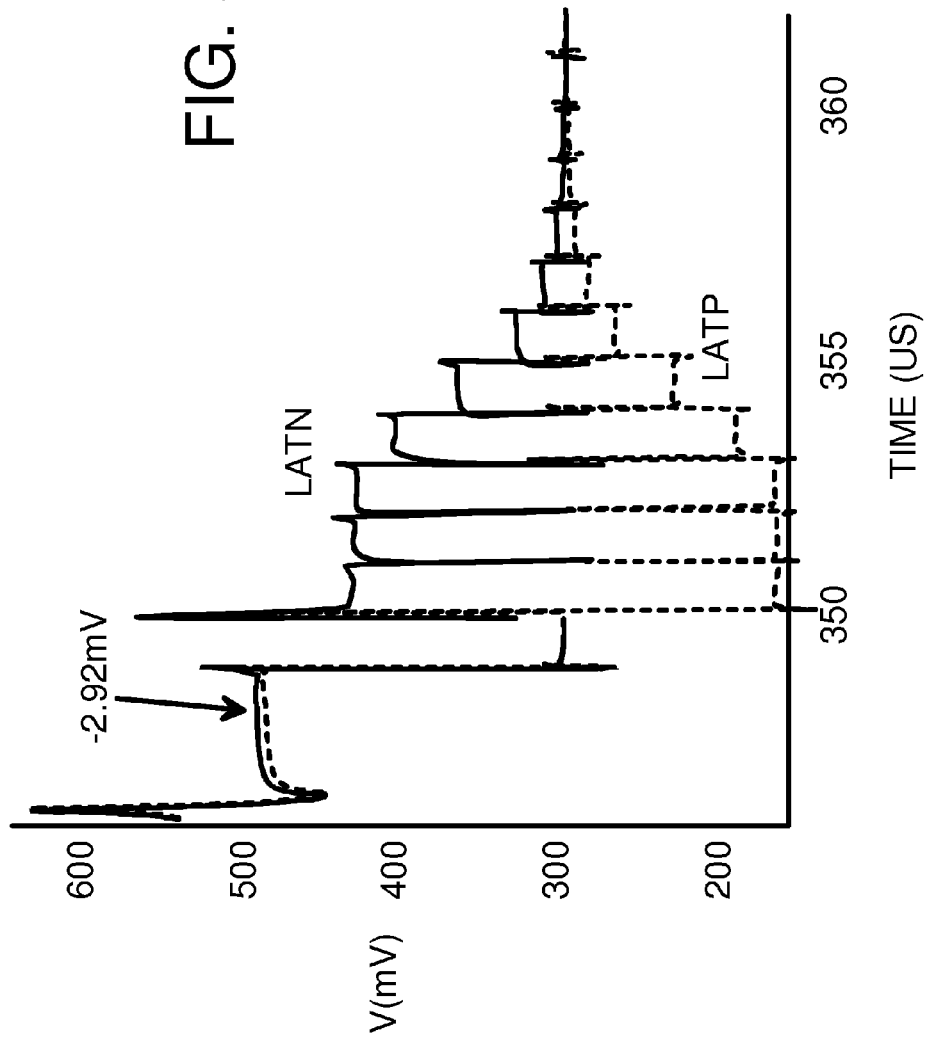
FIG. 5 is a waveform showing autozeroing by the pre-amplifier.

FIG. 5 is a waveform showing autozeroing by the pre-amplifier. An offset voltage of −2.92 mV is applied to the inputs INP, INN during a simulation. Autozeroing starts at about 345 us and ends at about 349 us in the simulation. The pre-amplifier performs sample and conversion during the several pulses shown. During several cycles this offset is stored on offset capacitors 78, 88 and the feedback loop causes LATP, LATN to eventually equalize and settle at about 0.3 volts.

Figure 6:
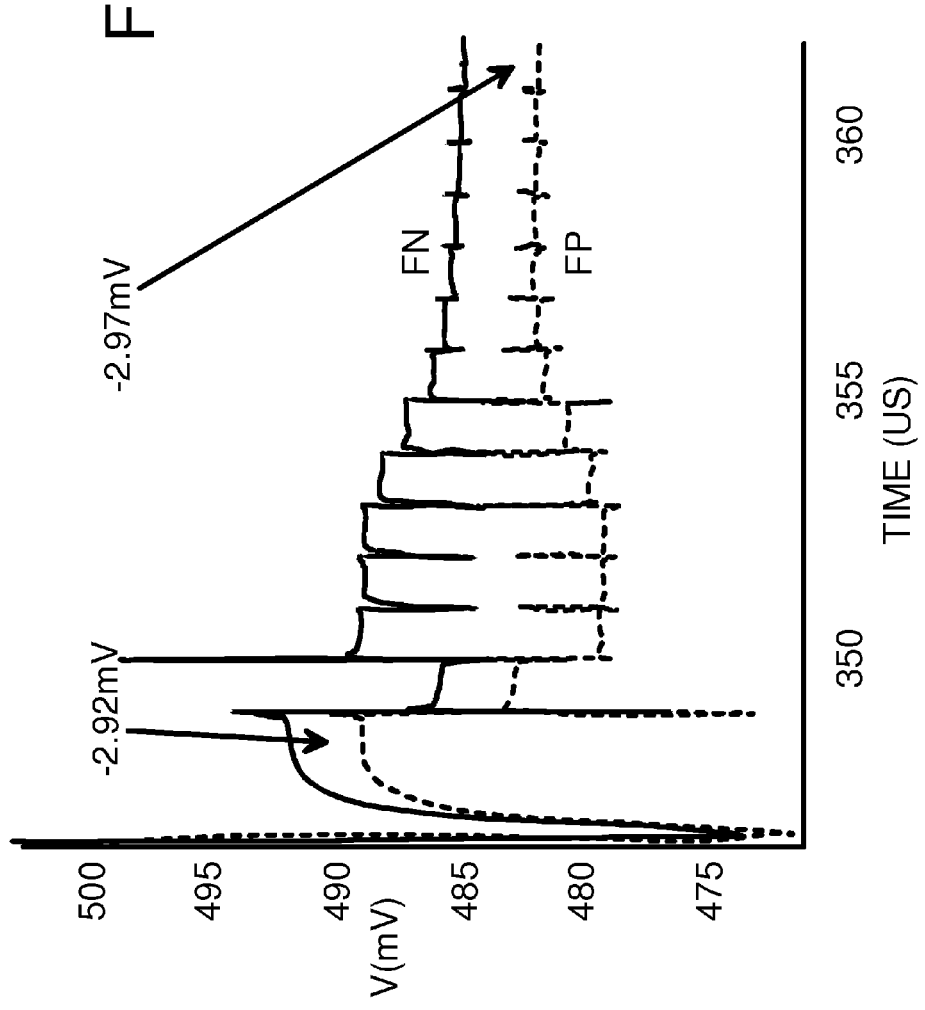
FIG. 6 is a waveform showing an offset being stored in the pre-amplifier.

FIG. 6 is a waveform showing an offset being stored in the pre-amplifier. An offset voltage of −2.92 mV is applied to the inputs INP, INN during a simulation. During several autozeroing cycles, nodes FP, FN, which are also the voltages of offset capacitors 78, 88, settle between 0.48 and 0.49 volts, with a difference of −2.97 mV representing the stored offset. Note that the stored offset of −2.97 mV is only 0.05 mV off from the true offset of −2.92 mV. This represents an error of only 1.7% of the injected offset.

Figure 7:
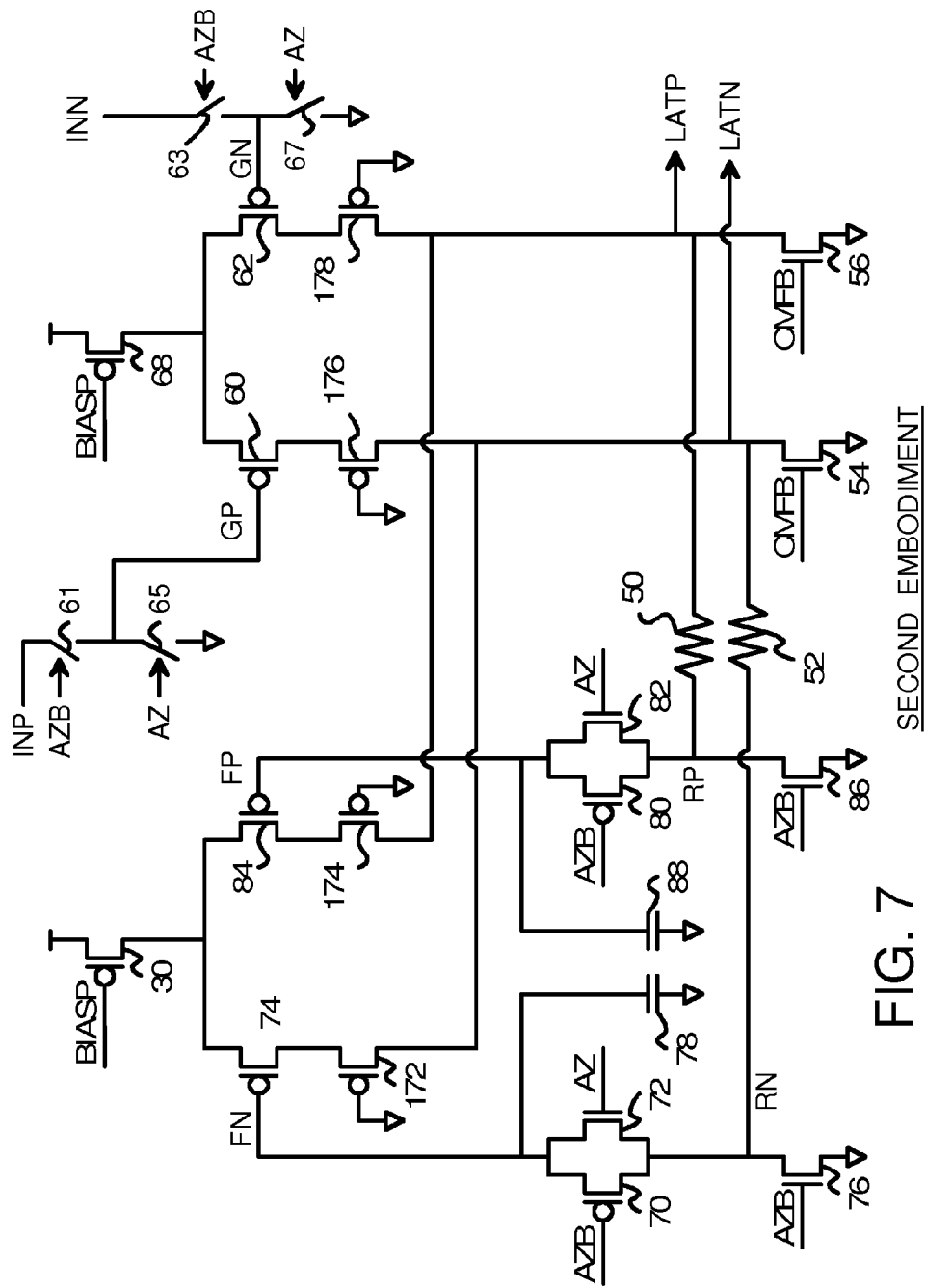
FIG. 7 is a second embodiment of the pre-amplifier with kickback charge isolation.

FIG. 7 is a second embodiment of the pre-amplifier with kickback charge isolation. Kickback-charge isolation transistors 172, 174, 176, 178 are grounded-gate p-channel transistors that isolate kickback charge between the feedback and main amplifier sections. Kickback charge refers to charge injection during switching. Isolating the kickback charge has the advantage of preventing charge injection from disturbing the comparator.

Since the gates of kickback-charge isolation transistors 172, 174, 176, 178 are grounded, these operate in the linear region and do not cut a significant part of the supply voltage headroom. However, there is some voltage loss due to these transistors.

Figure 8:
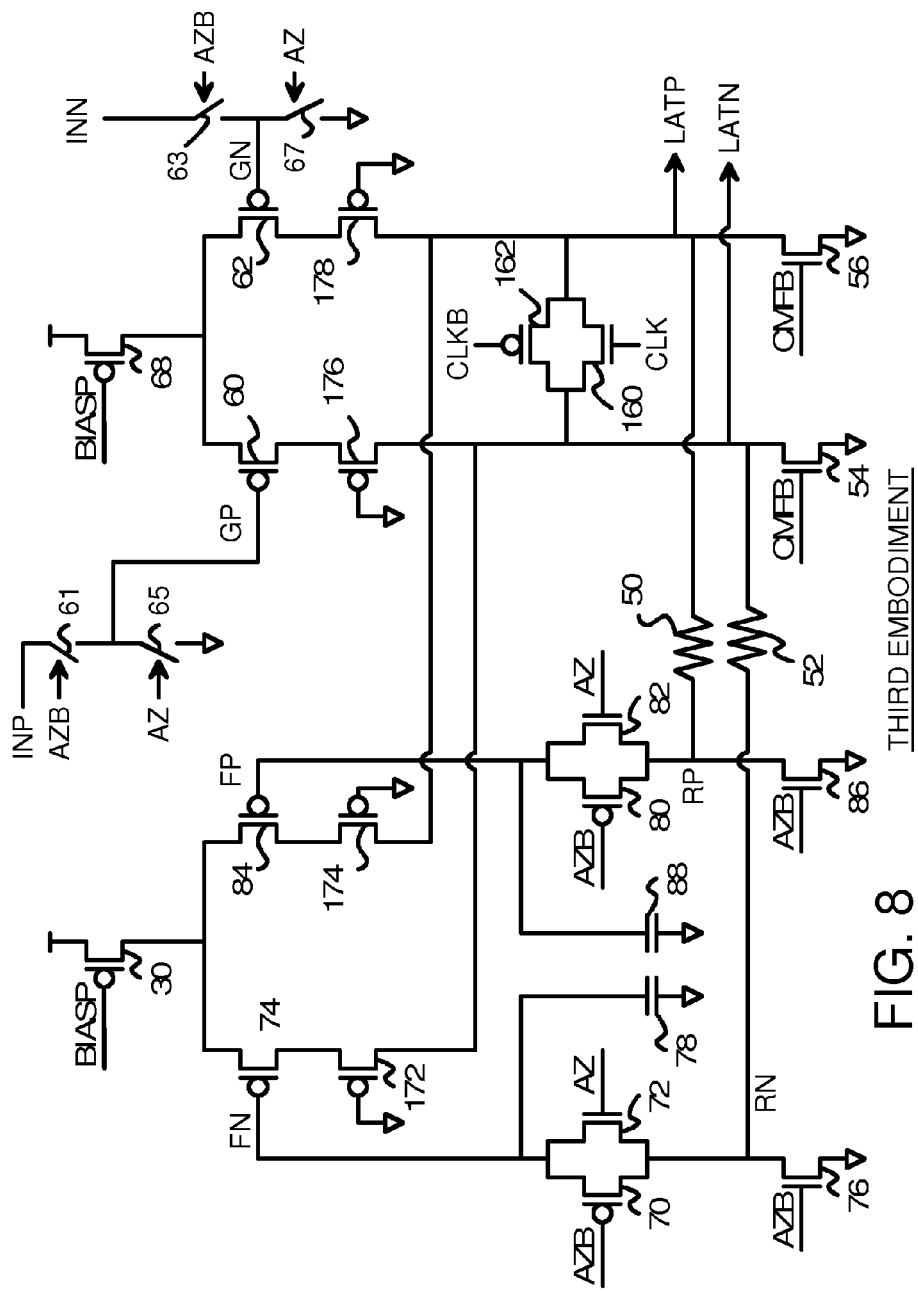
FIG. 8 is a third embodiment of the pre-amplifier with equalization.

FIG. 8 is a third embodiment of the pre-amplifier with equalization. Equalizing transistors 160, 162 are added. When an equalization clock CLK is high, transistors 160, 162 turn on, shorting LATP to LATN. CLK can be pulsed high just before every comparison to allow for a faster settling of LATP, LATN. This forces and adjustment to the charge stored on offset capacitors 78, 88.

CMFB is Common Mode Feedback. The CMFB signal is used during autozeroing as the preamplifier is reconfigured as a fully differential opamp. The CMFB signal is generated by another copy of the low voltage preamplifier with an output diode connected. This copy of the preamplifier does not require a high gain and is off during comparison An example of voltages of internal nodes is AZ=1V, AZB=0V, FB and FN=0.5V, CMFB=0.5V, and the power Vcc voltage is 1V. The process gate length in microns is 0.18 um in this example.

ALTERNATE EMBODIMENTS

Several other embodiments are contemplated by the inventors. For example other embodiments may be combinations of those shown. Equalizing transistors 160, 162 could be added without adding kickback-charge isolation transistors 172, 174, 176, 178. Switches can be implemented as transmission gates with p-channel and n-channel transistors in parallel, or as a single transistor, either p-channel or n-channel. A different latch circuit may be used with the pre-amplifier. While an ADC application has been shown, the pre-amplifier could be used in other circuits, such as DACs, comparators, low noise amplifiers, instrumentation amplifiers, or any offset cancellation amplifier.

Buffers, inverters, gating logic, capacitors, resistors, or other elements may be added at various locations in the circuit for a variety of reasons unrelated to the invention, such as for power savings modes.

Signals may be encoded, compressed, inverted, combined, or otherwise altered. Clocks may be combined with other signals or conditions. The entire circuit or portions of it could be inverted and p-channel and n-channel transistors swapped.

Directional terms such as upper, lower, up, down, top, bottom, etc. are relative and changeable as the system, circuit, or data is rotated, flipped over, etc. These terms are useful for describing the device but are not intended to be absolutes. Signals may be active high or active low, and may be inverted, buffered, encoded, qualified, or otherwise altered.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. The final sizes of transistors and capacitors may be selected after circuit simulation or field testing. Metal-mask options or other programmable components may be used to select the final capacitor, resistor, or transistor sizes.

P-channel rather than n-channel transistors (or vice-versa) may be used for some technologies or processes, and inversions, buffers, capacitors, resistors, gates, or other components may be added to some nodes for various purposes and to tweak the design. Timings may be adjusted by adding delay lines or by controlling delays. Separate power supplies and grounds may be used for some components. Various filters could be added. Active low rather than active high signals may be substituted.

While positive currents have been described, currents may be negative or positive, as electrons or holes may be considered the carrier in some cases. Source and sink currents may be interchangeable terms when referring to carriers of opposite polarity. Currents may flow in the reverse direction. A fixed bias voltage may be switched to power or ground to power down the circuit.

While Complementary-Metal-Oxide-Semiconductor (CMOS) transistors have been described, other transistor technologies and variations may be substituted, and materials other than silicon may be used, such as Galium-Arsinide (GaAs) and other variations.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An offset-canceling amplifier comprising:
    a first differential transistor having a gate receiving a true input during an amplifying phase;
    a second differential transistor having a gate receiving a complement input during the amplifying phase;
    a first current sink transistor that sinks current from the first differential transistor;
    a second current sink transistor that sinks current from the second differential transistor;
    a first output between the first differential transistor and the first current sink transistor;
    a second output between the second differential transistor and the second current sink transistor;
    a first offset capacitor for storing a first offset charge;
    a second offset capacitor for storing a second offset charge;
    a first feedback transistor having a gate controlled by the first offset capacitor, and driving a first offsetting current to the first output in response to the first offset charge stored on the first offset capacitor;
    a second feedback transistor having a gate controlled by the second offset capacitor, and driving a second offsetting current to the second output in response to the second offset charge stored on the second offset capacitor;
    a first feedback switch for isolating the first offset capacitor from a first feedback node during the amplifying phase;
    a second feedback switch for isolating the second offset capacitor from a second feedback node during the amplifying phase;
    a first feedback resistor coupled between the first output and the first feedback node; and
    a second feedback resistor coupled between the second output and the second feedback node,
    whereby the first and second offset charge cancel differential offsets in the offset-canceling amplifier.

2. The offset-canceling amplifier of claim 1 further comprising:
    a first linear transistor for terminating the first feedback node during the amplifying phase;
    a second linear transistor for terminating the second feedback node during the amplifying phase.

3. The offset-canceling amplifier of claim 2 wherein a gain of the offset-canceling amplifier during the amplifying phase is a function of a resistance value of the first feedback resistor and of the second feedback resistor.

4. The offset-canceling amplifier of claim 2 wherein the first linear transistor connects the first feedback node to a ground;
    wherein the second linear transistor connects the first feedback node to the ground, whereby the first and second feedback nodes are terminated to ground during the amplifying phase.

5. The offset-canceling amplifier of claim 2 further comprising:
    a first grounding switch for grounding the gate of the first differential transistor during an autozeroing phase when the amplifying phase is not active;
    a second grounding switch for grounding the gate of the second differential transistor during the autozeroing phase.

6. The offset-canceling amplifier of claim 5 further comprising:
    a main current source coupled to source a main current to the first differential transistor and to the second differential transistor;
    a feedback current source coupled to source a feedback current to the first feedback transistor and to the second feedback transistor.

7. The offset-canceling amplifier of claim 6 wherein the first current sink transistor has a gate receiving a common-mode voltage;
    wherein the second current sink transistor has a gate receiving the common-mode voltage;
    wherein the common-mode voltage is between a power-supply voltage and the ground.

8. The offset-canceling amplifier of claim 7 further comprising:
    wherein the first current sink transistor and the second current sink transistor are biased to operate in a saturated region of operation;
    wherein the first linear transistor and the second linear transistor are biased to operate in a linear region of operation.

9. The offset-canceling amplifier of claim 2 further comprising:
    a first cascode transistor coupled to conduct current between the first differential transistor and the first output;

a second cascode transistor coupled to conduct current between the second differential transistor and the second output.

10. The offset-canceling amplifier of claim 9 further comprising:
a first feedback cascode transistor coupled to conduct current between the first offset capacitor and the gate of the first feedback transistor;
a second feedback cascode transistor coupled to conduct current between the second offset capacitor and the gate of the second feedback transistor.

11. The offset-canceling amplifier of claim 10 wherein the first differential transistor, the second differential transistor, the first feedback transistor, and the second feedback transistor are p-channel transistors;
wherein the first cascode transistor, the second cascode transistor, the first feedback cascode transistor, and the second feedback cascode transistor each comprise a p-channel transistor with a grounded gate.

12. The offset-canceling amplifier of claim 2 wherein the first feedback switch comprises a first transmission gate having a p-channel transistor and an n-channel transistor in parallel;
wherein the second feedback switch comprises a second transmission gate having a p-channel transistor and an n-channel transistor in parallel.

13. The offset-canceling amplifier of claim 2 further comprising:
an equalizing switch coupled between the first output and the second output, the equalizing switch for shorting the first output to the second output before the amplifying phase.

14. The offset-canceling amplifier of claim 13 wherein the equalizing switch comprises a transmission gate having a p-channel transistor and an n-channel transistor in parallel.

15. An autozeroing pre-amplifier comprising:
a main current source driving a main source current to a main source node;
a first differential transistor having a first gate that controls a first current between the main source node and a first output node;
a second differential transistor having a second gate that controls a second current between the main source node and a second output node;
a first sink transistor having a gate receiving an intermediate voltage, for sinking the first current to a ground;
a second sink transistor having a gate receiving the intermediate voltage, for sinking the second current to the ground;
a first feedback resistor coupled between the first output node and a first feedback node;
a second feedback resistor coupled between the second output node and a second feedback node;
a first terminating transistor having a gate receiving an amplifying phase signal that is driven high to a power-supply voltage during an amplifying phase, the first terminating transistor connecting the first feedback node to the ground when the amplifying phase signal is high;
a second terminating transistor having a gate receiving the amplifying phase signal, the second terminating transistor connecting the second feedback node to the ground when the amplifying phase signal is high;
a first capacitor that stores a first charge on a first charge node;
a second capacitor that stores a second charge on a second charge node;
a first feedback switch for connecting the first charge node to the first feedback node when an autozeroing signal is high during an autozeroing phase, and for isolating the first charge node during the amplifying phase;
a second feedback switch for connecting the second charge node to the second feedback node when the autozeroing signal is high, and for isolating the second charge node during the amplifying phase;
a feedback current source driving a feedback source current to a feedback source node;
a first feedback transistor having a gate controlled by the first charge node to control a first feedback current from the feedback source node to the first output node; and
a second feedback transistor having a gate controlled by the second charge node to control a second feedback current from the feedback source node to the second output node.

16. The autozeroing pre-amplifier of claim 15 further comprising:
a first input switch for connecting a first differential input to the first gate during the amplifying phase;
a second input switch for connecting a second differential input to the second gate during the amplifying phase;
a first grounding switch for grounding the first gate during the autozeroing phase; and
a second grounding switch for grounding the second gate during the autozeroing phase.

17. The autozeroing pre-amplifier of claim 16 wherein the first differential transistor, the second differential transistor, the first feedback transistor, the second feedback transistor, the main current source, and the feedback current source are p-channel transistors;
wherein the first sink transistor, the second sink transistor, the first terminating transistor, and the second terminating transistor are n-channel transistors with grounded sources.

18. The autozeroing pre-amplifier of claim 17 further comprising:
a first cascode transistor coupled to conduct current between the first differential transistor and the first output node;
a second cascode transistor coupled to conduct current between the second differential transistor and the second output node;
a first feedback cascode transistor coupled to conduct current between the first capacitor and the gate of the first feedback transistor;
a second feedback cascode transistor coupled to conduct current between the second capacitor and the gate of the second feedback transistor;
wherein the first cascode transistor, the second cascode transistor, the first feedback cascode transistor, and the second feedback cascode transistor each comprise a p-channel transistor with a grounded gate.

19. The autozeroing pre-amplifier of claim 15 further comprising:
an analog input having an analog input voltage;
a Successive-Approximation-Register (SAR) having a digital value that is successively adjusted to converge to closer approximations of the analog input voltage;
a digital-to-analog converter (DAC), receiving a reference voltage and the digital value from the SAR, for generating a converted analog voltage represented by the digital value;
a series of stages including a first stage and a final stage, the first stage receiving the converted analog voltage and the analog input voltage as stage inputs, the final stage outputting compare results as stage outputs, wherein each intermediate stage in the series of stages has stage inputs coupled to stage outputs of a prior stage and stage outputs connected to stage inputs of a following stage;

a final latch, coupled to receive the compare results from the final stage, for latching the compare results for transmission to the SAR, wherein the SAR adjusts the digital value based on the compare results from the final latch;

wherein each stage in the series of stages comprises:
 a replica of the autozeroing pre-amplifier;
  wherein the first differential input and the second differential input are the stage inputs;
  wherein the first output node and the second output node are the stage outputs;

wherein the autozeroing pre-amplifier is replicated to the series of stages in an Analog-to-Digital Converter (ADC).

20. An amplifier comprising:

first differential transistor means for driving a first current in response to a first gate receiving a true input during an amplifying phase;

second differential transistor means for driving a second current in response to a second gate receiving a complement input during the amplifying phase main current source means for supplying a main current to the first differential transistor means and to the second differential transistor means;

first grounding switch means for grounding the first gate of the first differential transistor means during an autozeroing phase when the amplifying phase is not active;

second grounding switch means for grounding the second gate of the second differential transistor means during the autozeroing phase;

first current sink transistor means for sinking the first current from the first differential transistor means;

second current sink transistor means for sinking the second current from the second differential transistor means;

a first output between the first differential transistor means and the first current sink transistor means;

a second output between the second differential transistor means and the second current sink transistor means;

first offset capacitor means for storing a first offset charge;

second offset capacitor means for storing a second offset charge;

first feedback transistor means for driving a first offsetting current to the first output in response to the first offset charge stored on the first offset capacitor means, and having a gate controlled by the first offset capacitor means;

second feedback transistor means for driving a second offsetting current to the second output in response to the second offset charge stored on the second offset capacitor means, and having a gate controlled by the second offset capacitor means;

feedback current source means for supplying a feedback current to the first feedback transistor means and to the second feedback transistor means;

first feedback switch means for isolating the first offset capacitor means from a first feedback node during the amplifying phase;

second feedback switch means for isolating the second offset capacitor means from a second feedback node during the amplifying phase;

first feedback resistor means for providing a resistance between the first output and the first feedback node; and second feedback resistor means for providing a resistance between the second output and the second feedback node;

first linear transistor means for terminating the first feedback node during the amplifying phase; and second linear transistor means for terminating the second feedback node during the amplifying phase, whereby the first and second offset charge cancel differential offsets in the amplifier.

* * * * *